US009960305B2

(12) United States Patent
Olsen (10) Patent No.: US 9,960,305 B2
(45) Date of Patent: May 1, 2018

(54) MANUFACTURE OF SOLAR CONCENTRATOR MODULES USING A WAFER PRECURSOR

(71) Applicant: SPAWAR Systems Center Pacific, San Diego, CA (US)

(72) Inventor: Randall B. Olsen, Carlsbad, CA (US)

(73) Assignee: The United States of America as represented by Secretary of the Navy, Washington, DC (US)

( * ) Notice: Subject to any disclaimer, the term of this patent is extended or adjusted under 35 U.S.C. 154(b) by 0 days. days.

(21) Appl. No.: 15/271,985

(22) Filed: Sep. 21, 2016

(65) Prior Publication Data

US 2018/0083153 A1    Mar. 22, 2018

(51) Int. Cl.

| H01L 21/00   | (2006.01) |
| H01L 31/054  | (2014.01) |
| H02S 20/32   | (2014.01) |
| H01L 31/02   | (2006.01) |
| H01L 31/0216 | (2014.01) |
| H01L 31/048  | (2014.01) |
| H01L 31/05   | (2014.01) |
| H01L 31/052  | (2014.01) |
| H01L 31/18   | (2006.01) |

(52) U.S. Cl.
CPC ...... *H01L 31/0547* (2014.12); *H01L 31/0201* (2013.01); *H01L 31/02013* (2013.01); *H01L 31/02167* (2013.01); *H01L 31/048* (2013.01); *H01L 31/0508* (2013.01); *H01L 31/0512* (2013.01); *H01L 31/0521* (2013.01); *H01L 31/1876* (2013.01); *H02S 20/32* (2014.12)

(58) Field of Classification Search
None
See application file for complete search history.

(56) References Cited

U.S. PATENT DOCUMENTS

| 5,118,361 A     | 6/1992  | Fraas                   |
| 6,008,449 A     | 12/1999 | Cole                    |
| 6,215,060 B1 *  | 4/2001  | Komori ........ B32B 27/08 |
|                 |         | 136/251                 |
| 6,441,297 B1    | 8/2002  | Keller                  |
| 6,841,728 B2    | 1/2005  | Jones                   |
| 8,329,503 B1    | 12/2012 | Nielson                 |

(Continued)

*Primary Examiner* — Angel Roman
(74) *Attorney, Agent, or Firm* — SPAWAR Systems Center Pacific; Kyle Eppele (57) ABSTRACT

A wafer precursor for creating photovoltaic (PV) concentrator modules and a method for fabricating solar concentrator modules using the wafer precursor. The method includes providing a crystalline silicon wafer substrate that can be used to make multiple concentrator cells to be incorporated into concentrator modules. The method also includes applying fingers as horizontal grid lines onto the crystalline silicon wafer substrate. The method also includes applying bus bars onto the crystalline silicon wafer substrate to form separate top grid structures. The number of separate top grid structures is at least two when the concentrator module is part of an optical system that has a concentration ratio of between about 8 and about 16 times sunlight. The number of top grid structures is at least three when the concentrator module is part of an optical system that has a concentration ratio of between about 17 and about 50.

17 Claims, 9 Drawing Sheets

(56) References Cited

U.S. PATENT DOCUMENTS

| | | |
|---|---|---|
| 9,126,392 B1 | 9/2015 | Nielson |
| 9,287,430 B1 | 3/2016 | Nielson |
| 2003/0213514 A1* | 11/2003 | Ortabasi ............... H01L 31/052 |
| | | 136/246 |
| 2007/0227581 A1 | 10/2007 | Chen |
| 2009/0078305 A1* | 3/2009 | Nishiwaki ....... H01L 31/022433 |
| | | 136/249 |
| 2010/0263709 A1* | 10/2010 | Norman .................... F24J 2/07 |
| | | 136/246 |
| 2011/0271954 A1 | 11/2011 | Suh |
| 2013/0118553 A1 | 5/2013 | Gu |
| 2015/0280044 A1* | 10/2015 | Derkacs ............. H01L 31/0504 |
| | | 136/251 |

* cited by examiner

MANUFACTURE OF SOLAR CONCENTRATOR MODULES USING A WAFER PRECURSOR

STATEMENT OF GOVERNMENT INTEREST

Federally-Sponsored Research and Development

The United States Government has ownership rights in this invention. Licensing inquiries may be directed to Office of Research and Technical Applications, Space and Naval Warfare Systems Center, Pacific, Code 72120, San Diego, Calif., 92152; telephone (619)553-5118; email: ssc_pac_t2@navy.mil. Reference Navy Case No. 102,586.

BACKGROUND OF THE INVENTION

Field of Invention

This disclosure relates generally to conversion of radiant energy (e.g. sunlight) to electricity using photovoltaic materials, and more particularly, to concentrated solar power.

Description of Related Art

Harvesting of renewable energy, including solar energy, has become increasingly important. Over the years, a variety of systems have been devised for the collection and utilization of solar energy. Many of these systems are quite efficient in collecting and storing solar energy which may supplement or replace more expensive systems.

However, a primary problem remains. That problem is the initial cost of making and installing an efficient solar energy collecting system. If a solar energy collecting system is very expensive to make and install, such high capital expenditure is undesirable, since the potential user must wait too long to amortize this cost before realizing any savings in energy expense.

It is well known that solar energy may be converted into other useful forms of energy by using proper techniques. For example, solar energy may be converted into electrical energy by a so-called solar cell, which is incorporated into a concentrator module. The concentrator module is, in turn, incorporated into a concentrator receiver. The most common solar cells are made of silicon, but cells made of other materials, e.g., cadmium sulfide and gallium arsenide, have also been developed and tested. The required voltage and/or amperage may be generated using an appropriate series-parallel matrix in an integrated array.

At the current state of the art, a principal obstacle to wide-scale adoption of solar energy collector installations is that manufacturing and installation costs of solar cell arrays generally are substantially higher than the cost of conventional electrical energy generating installations. Another factor limiting widespread adoption of solar panel cells is radiant heating of the cells which reduces cell efficiency.

In addition to the photoelectric conversion technique described above, it is well known that solar energy may be converted to other more useful forms of energy through thermal conversion techniques. However, as in the case of solar cells, relatively high cost of manufacturing and relatively high installation costs have presented a principal obstacle to wide scale adoption of solar thermal energy collectors. Thus, any technique which reduces the cost of manufacturing and/or installing a solar thermal energy collector system may have significant commercial importance.

One technique that has been developed to increase efficiency of solar cells and thermal converters is to collect and focus solar energy onto the solar cells or thermal converters by means of a "solar concentrator". Thus, a typical solar energy collection system may include reflective or refractive devices which are designed to collect solar energy impinging upon a relatively large area and to focus the collected energy onto a relatively small area of utilization. While the use of solar concentrators results in economic savings by increasing the effective collection area of a solar cell or thermal converter, the prior art solar concentrators themselves are costly to manufacture, and also may add appreciably to the weight of the solar energy collector system. This latter consideration is particularly important in the case of solar cell or solar thermal energy collector systems which are to be used on buildings since the heavier a solar energy collector system is, the more costly the required supporting structure.

There is a need for a concentrator module and a method for manufacturing a concentrator module at a reduced cost.

There is further a need for a concentrator module that is increases the effective collection area of a solar cell/module or thermal converter.

BRIEF SUMMARY OF INVENTION

The present disclosure addresses the needs noted above by providing a method for manufacturing a photovoltaic concentrator module using a wafer precursor and a system for manufacturing a photovoltaic concentrator module.

In accordance with one embodiment of the present disclosure, a method is provided for producing a photovoltaic concentrator module from a wafer precursor. The method comprises the steps of providing a wafer precursor composed of a crystalline wafer substrate; and applying, via a silk screen printing device, fingers onto the wafer substrate. The fingers are applied as horizontal grid lines across the wafer substrate. The method further includes applying bus bars onto the wafer substrate. The bus bars are applied in a direction perpendicular to the grid lines to form multiple separate top grid structures. The optimal number of separate top grid structures is at least two for each concentrator module that is part of an optical system having a concentration ratio of between about eight (8) and about sixteen (16). Alternatively, the number of top grid structures is at least three for each concentrator module that is part of an optical system having a concentration ratio of between about seventeen (17) and about fifty (50). The method also comprises cutting the crystalline silicon wafer into two or more pieces. The cutting is performed in a direction perpendicular to said bus bars.

These, as well as other objects, features and benefits will now become clear from a review of the following detailed description, the illustrative embodiments, and the accompanying drawings.

BRIEF DESCRIPTION OF DRAWINGS

The accompanying drawings, which are incorporated in and form a part of the specification, illustrate example embodiments and, together with the description, serve to explain the principles of the invention. In the drawings.

DETAILED DESCRIPTION OF THE INVENTION

Disclosed herein is a concentrator module that includes a solar concentrator cell. The solar concentrator cell is manufactured using a wafer precursor. Also disclosed herein is a method for fabricating the solar concentrator cell using a wafer precursor. The concentrator cell/module may be used with a solar energy concentrator system that substantially overcomes or avoids a number of the aforesaid problems encountered in the manufacture and use of solar energy collector systems according to the prior art.

Multiple concentrator cells may result from a single wafer precursor, as disclosed herein. The concentrator cells are photovoltaic cells that are relatively lightweight. These concentrator cells can be manufactured using relatively inexpensive, commercially available materials and existing manufacturing infrastructure. These materials and infrastructure were developed for the one-sun industry also sometimes known as the flat-panel photovoltaic (PV) industry.

Concentrator cells are capable of generating a greater amount of energy than conventional solar cells. When a conventional solar cell is used, it is placed in regular sunlight, without concentration. In the concentrator art, this typical type of solar cell may be known as a "one-sun" cell. On the other hand, concentrator cells concentrate sunlight so that the amount of energy generated is multiplied.

The concentrator cell described herein will be incorporated into a concentrator module. The concentrator cell is made from a wafer precursor composed of a crystalline silicon wafer substrate. Fingers are formed as horizontal grid lines on the crystalline silicon wafer substrate. Bus bars are applied to the crystalline silicon wafer substrate. The bus bars are applied in a direction perpendicular to the grid lines to form separate top grid structures.

The number of separate top grid structures is either at least two for each concentrator module, or the number of top grid structures is at least three for each concentrator module. When the number of separate top grid structures is at least two for each concentrator module, the concentrator module is part of solar energy collector system that has a concentration ratio of between about eight and about sixteen times sunlight. When the number of separate top grid structures is at least three for each concentrator module, the concentrator module is part of a solar energy collector system that has a concentration ratio of between about seventeen and about fifty times sunlight.

Figure 1:
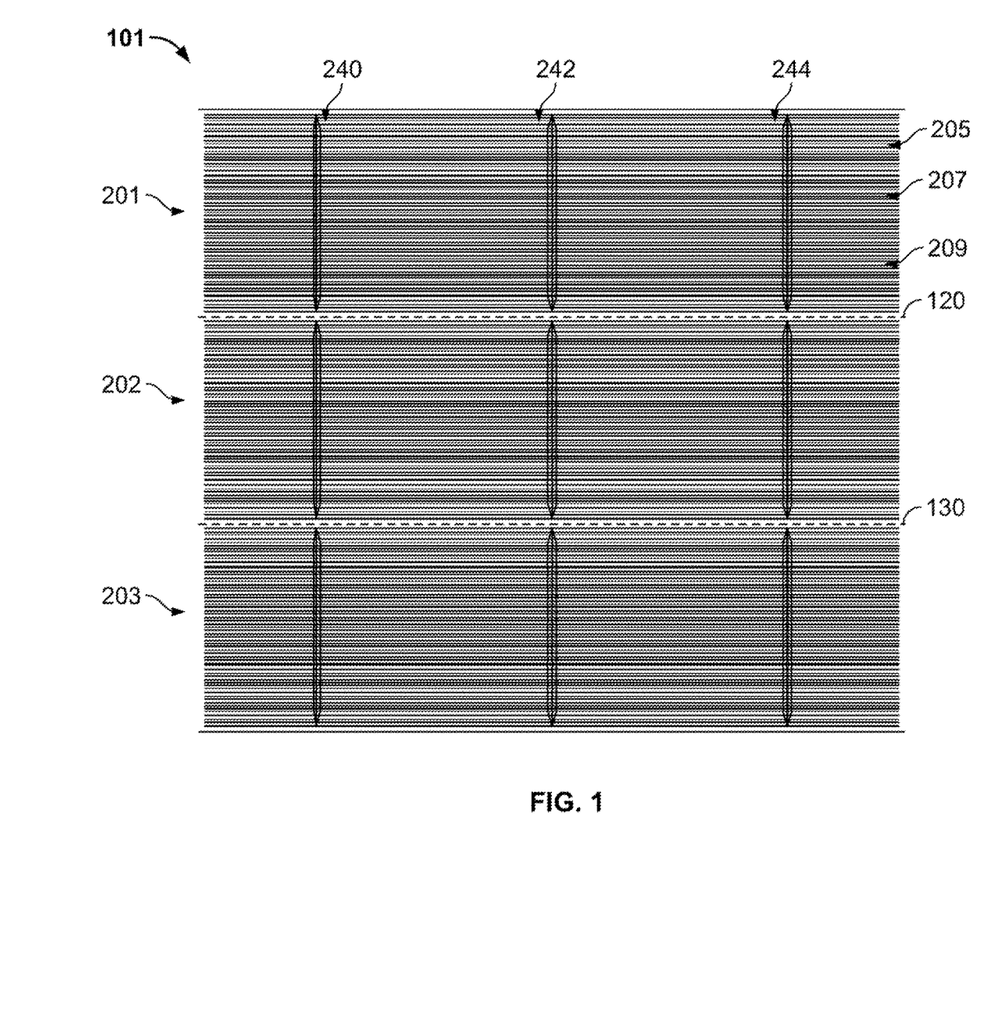
FIG. 1 shows a top view of a wafer precursor for a concentrator cell (which is made part of a concentrator module) in accordance with one embodiment of the present disclosure.

Referring now to FIG. 1, illustrated is a top view (or "sunny-side" view) of a wafer precursor 101 for a concentrator cell in accordance with one embodiment of the present disclosure. The wafer appears similar to a conventional solar cell common in the flat-panel PV prior art. That is because wafer precursor 101 is made using the same processes as common one-sun cells. It is substantially the same size as wafers used in conventional solar cells, e.g., 156 mm×156 mm. It is also made of the same material as wafers of conventional solar cells. The fact that wafer precursor 101 can be produced using the same processes as one-sun cells is an important innovation. This manufacturability using one-sun methods and equipment makes wafer precursor 101 both inexpensive to produce and immediately scalable to extremely high volume.

The wafer precursor 101 may be a substrate composed of a crystalline silicon material, including a polycrystalline or a monocrystalline silicon material, as is known in the art. The present illustration shows a wafer precursor 101 composed of monocrystalline silicon. Monocrystalline silicon wafers or panels may be formed from a single continuous crystal structure. For monocrystalline wafers, a silicon crystal seed may be placed in a container of molten silicon. The molten silicon and the crystal seed may be used to form a solid crystal structure around the seed. The molten silicon and crystal may be finely sliced into monocrystalline silicon wafers.

Polycrystalline silicon wafer precursors may be made in a similar manner to the above-referenced wafer precursor 101 that is made of monocrystalline silicon. Like the monocrystalline wafer precursor, a polycrystalline wafer precursor may also be made with a silicon crystal seed that is placed in a container of molten silicon. However, unlike the monocrystalline wafer creation process, the polycrystalline process involves cooling the container of silicon rather than drawing up the seed with the molten silicon.

Wafer precursor 101 can be produced in factories which require much lower capital expenditure per Watt of electrical output than one-sun solar cells, i.e., solar cells that use regular sunlight without concentration. The reduction in capital expenditure is directly related to the fact that the wafer precursor 101 can be used in concentrated photovoltaic (PV) systems which require far fewer wafers per Watt due to the fact that the sunlight in concentrator systems is in fact "concentrated." For example, when used in a concentrated PV system operating at twenty times (20x) concentration of sunlight, the amount of wafers can be reduced by roughly 20x. Hence the capital expenditure of a factory that produces wafer of the present disclosure can be reduced by a similar amount (roughly 20x).

The wafer precursor 101 of FIG. 1 is similar to wafers used for conventional solar cells. As noted above, the dimensions of the wafer precursor 101 may be the same as those used for conventional solar cells, e.g., 156 mm×156 mm. Materials used for wafer precursor 101 are also similar to those of conventional solar cells. The material may be monocrystalline or polycrystalline silicon. Bare regions 120 and 130 divide the wafer into thirds, each third making up about 52 mm per cell on this 156 mm wafer. The wafer precursor 101 may be divided or cut along these bare regions 120, 130 to form three distinct concentrator cells 201, 202, 203. The present wafer precursor 101 of FIG. 1 contains what will eventually become three (3) solar concentrator cells 201, 202, 203.

It may be evident that wafer precursor 101 is not a conventional solar cell in that the fingers (or horizontal grid lines, e.g., fingers 205, 207, 209) are much more closely spaced together than in a conventional one-sun cell. The closely-spaced fingers (e.g., 205, 207, 209) may be formed on the wafer precursor 101 by a silk screen printing device, as is known in the art. An example of a suitable silk screen printing device is the Aremco® Accu-Coat™ Screen Printer. The fingers may be formed of silver and/or silver paste.

Although silver is used in this embodiment of the fingers 205, 207, 209, the industry is expected to start migrating to electroplated fingers which may be narrower. The materials cost of silver may drive this transition. Silver may be eliminated and replaced by copper, thereby saving material cost. One reason the industry has not changed over yet may be a higher capital cost of equipment for the new electroplaters which may replace the silk-screen equipment.

The reason for this closer finger spacing for fingers 205, 207, 209 is that when a solar cell is used in concentrated sunlight, much higher currents may be generated and thus a high density of conducting fingers may be necessary to carry the current. The density of the fingers formed on the present wafer precursor 101 may be twice the density of a conventional one-sun solar cell. The width and thickness of each finger may be in accordance with widths and thicknesses used in the one-sun PV industry. For example, the width may be about one hundred microns and the thickness may be about two (2) to thirty (30) microns. Alternatively, any other width and thickness may be used that is suitable for the appropriate density of fingers. The higher the concentration of sunlight, the greater the need to increase the number of fingers, e.g., 205, 207, 209, per unit length along the cell. For example, in the case of an optical system which concentrates the sunlight by a factor of about 17-50× (geometric) it has been found that approximately sixty (60) to eighty (80) fingers per approximately two inch (52 mm) cell (or thirty (30) to forty (40) fingers per inch) may give optimally efficient performance. In the case of an optical system that concentrates light by a factor of eight (8) to sixteen (16) times sunlight, approximately twenty (20) to twenty-nine (29) fingers per inch may be suitable.

A greater number of fingers, e.g., 205, 207, 209, would reduce the series resistance of the cells 201, 202, 203 (thus lowering the resistive losses of the system). More fingers, e.g., 205, 207, 209, would also shade more of the cells 201, 202, 203 from receiving sunlight. Hence, there is a desirable number of fingers which depends upon the amount of concentration desired to be achieved in the optical system. As noted above, the fingers e.g., 205, 207, 209, may be applied by silk screening using a conventional silk screen printing machine. It could take as little as one second for all of the fingers to be applied to a single wafer precursor 101. A robot may load the wafer precursor and apply the silk screening in ways that are known with silk screen printing devices.

FIG. 1 illustrates three concentrator cells 201, 202, 203 on wafer precursor 101. The concentrator cells 201, 202, 203 are covered by fingers (e.g., 205, 207, 209) and bus bars 240, 242, 244 which may be referred to hereinafter as "top grid structures." The number of top grid structures that are needed depends on the sunlight concentration ratio of the optical system with which the concentrator cell or module may be used. In the concentrator cells 201, 202, 203 of FIG. 1, the number of top grid structures is three (3). These concentrator cells 201, 202, 203 are designed to be used with optical systems having a concentration ratio of between seventeen (17) and fifty (50), although a higher number of top grid structures can also be used.

If the desired concentration ratio of sunlight is lower, say between eight (8) and sixteen (16), then the number of top grid structures may be two (2), although a higher number can also be used in this case. Furthermore, the desired number of top grid structures is one for cells 201, 202, 203 with a desired concentration ratio of between 2 and 10, although a higher number of top grid structures can also be used.

As stated above, each concentrator cell (e.g., 201, 202, 203) can be separated from the other concentrator cell by cutting the wafer precursor 101 of FIG. 1 along bare regions 120, 130. The cutting can also occur on other regions of the wafer precursor 101 deemed suitable. The wafer precursor 101 can be cut using a variety of cutting methods including, but not limited to, laser cutting (including high-powered laser cutting) by a laser (including a high-powered laser). Some companies provide such laser cutting services such as Potomac Photonics™ fabrication services, which performs laser micro-machining. The cutting may also be performed by a scribe-and-break method using a scribe. An example of such as glass-cutting scribe is the Red Devil®106370 DIY Glass Cutter which may be purchased at retail outlets such as Amazon.com™. The cutting can also be performed by diamond saw dicing using a diamond saw. An example of a diamond saw that may be used is the Mager Scientific® BR210 Precision Cut Off Saw (8"). The cutting can also be performed by chemical etching to remove layers from the surface of wafer precursor 101. This chemical etching is known in the art. The concentrator cells 201, 202, 203 may be cut and separated from each other in order to electrically isolate them from one another. The concentrator cells 201, 202, 203 may be re-soldered together at a later time.

Figure 2:
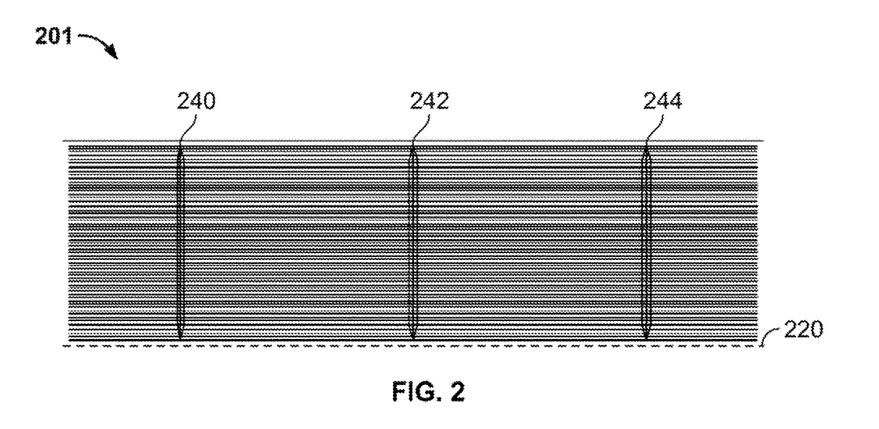
FIG. 2 shows a top view of the concentrator cell manufactured using the wafer precursor of FIG. 1.

FIG. 2 shows a top view (or "sunny-side" view) of a concentrator cell 201 of the present disclosure. The concentrator cell 201 is a specific geometry which matches a high volume standard of the one-sun cell and module manufacturing PV industry. Namely, it is patterned on a 156 mm wide wafer with a triple bus bar 240, 242, 244. Bus bars 240, 242, 244 may be made of a conducting metal, e.g., silver or aluminum, as is known in the art. The bus bars 240, 242, 244 may be applied by soldering tin ribbons onto the wafer precursor 101. The bus bars 240, 242, 244 may be "tinned" copper ribbons. The "tin" is soldered so the bus bars 240, 242, 244 are, in essence, pre-covered with solder. Concentrator cell 201 has been designed so that it can be picked and placed and then strung (i.e. have conducting wires soldered to it in cell-by-cell series fashion) automatically by equipment that is available from multiple vendors and commonly available within the photovoltaic industry. Concentrator cell 201 is also compatible with manual assembly processes. Thus, not only is the wafer precursor 101 manufacturable by one-sun wafer processes, but the resultant concentrator cell 201 is also compatible with one-sun stringing and module-making processes.

It important to note that not only does concentrator cell 201 have a higher density of conductive fingers to handle the higher current of a concentrator cell (versus a one-sun cell), but also that, in the present disclosure, the wafer precursor 201 is shortened when compared to the conventional solar cell. The concentrator cell 201 may be one-third the length of a conventional one-sun solar cell. The shortening accomplishes two things needed by a high performance concentrator cell. First, the shorter cell of both the wafer precursor 101 and resulting concentrator cell 201 has less area which reduces the total current handling requirement of the cell. Secondly, the shorter cell has shorter bus bars 240, 242, 244 which reduces the bus bar resistance. Bus bar resistance is another important contributor to the series resistance and hence electrical performance of cell 201.

Conventional concentrator cells are about one centimeter (1 cm) by 1 cm or smaller. Conventional solar cells are also typically multijunction cells (from the space industry) and hence very expensive. On the other hand, here, also useful for the present concentrator cell 201 and method is the use of a relatively large cell in a concentrator system. This possibility arises due to the somewhat unique architecture of the optical concentrator illustrated in FIGS. 8, and 9A-9D. The size of the optical array of the present concentrator system is relatively large compared to conventional concentrators. In our case, the concentrator system may be twenty feet (20') by fifty feet (50'), which equals one thousand square feet in area. On the other hand, conventional concentrators are usually 1 ft by 1 ft, which equals one square foot of area. Sometimes conventional concentrators are even smaller. The requirements of prior art optical concentrator architectures would not have enabled the economically powerful use of the concentrator cell of the present disclosure. Prior art optical concentrator architectures fall primarily into two classes: (1) small aperture concentrators, including both one-dimensional and two-dimensional systems; and (2) large aperture concentrators, which are essentially two-dimensional systems.

With small aperture systems, the required solar cells may be very small in size, e.g., one centimeter (1 cm) by one centimeter (1 cm). This size is on the order of thirty (30) to one hundred (100) times smaller than the size of the concentrator cell 201 of the present disclosure. In accordance with the present disclosure, through use of the phrase small apertures, we refer to concentrators that are on the order of one foot (1') by one foot (1') (i.e. 1 square foot in area). This is roughly the size of concentrating optics that have been market leaders of concentrating photovoltaics (e.g. concentrating voltaics by companies like Amonix®, Concentrix® and Solofocus®).

With the large aperture two-dimensionally concentrated systems, the concentration ratios are so high; typically two hundred times (200×) to fifteen hundred times (1500×) sunlight, that the cell/module of the present disclosure may not be suitable. The reason for this is that at such high levels of solar concentration input, one may have to use such a high density of grid lines on the face of a standard silicon cell that the shading of the cell would block so much of the light as to reduce the light to conversion efficiency to, e.g. under ten percent (10%) conversion efficiency. Such low conversion efficiency could increase the cost of the system when figured on a cost per Watt of electrical output basis, and hence make the cell and system impractical. Examples of such large aperture two-dimensionally concentrated architecture are presented by the various models developed by Solar Systems Pty, Ltd., an Australian-based company. By contrast to small apertures which have areas on the order of one square foot, large apertures in this context would refer to apertures which are roughly ten square feet (10 sq. ft.) to one thousand square feet (1000 sq. ft.) or even larger.

Figure 3:
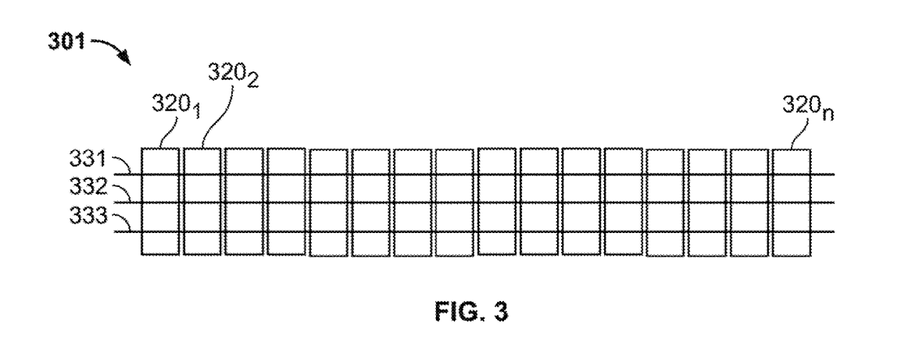
FIG. 3 shows a top view of a string made from concentrator cells in accordance with aspects of the present disclosure.

FIG. 3 shows a top view of a string 301 made from concentrator cells $320_1$ through $320_n$, inclusive, as described and claimed herein. The cells $320_1$ through $320_n$, inclusive, may be assembled electrically in series by conventional automated one-sun stringing equipment (e.g. stringing equipment manufactured by Spire Corporation in Bedford, Mass., U.S.A.) by soldering copper ribbons 331, 332, and 333 on the top of one cell to the bottom of the next cell in the string as is well known in the one-sun solar cell art. An example of a machine that may be suitable for soldering these copper ribbons is the Spire Corporation Spi-Assembler™ 7000.

Figure 4:
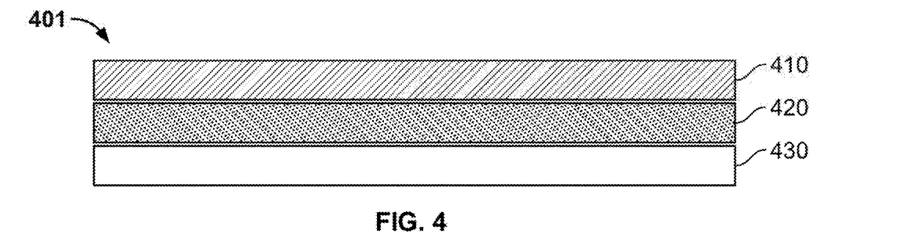
FIG. 4 is a side view which shows how the string of FIG. 3 gets encapsulated to protect it from the weather to create a concentrator module in accordance with one embodiment of the present disclosure.

FIG. 4 is a side view which shows how the string of FIG. 3 may be encapsulated to protect it from the weather to create a concentrator module 401. "Encapsulated" is a term of art for the conventional one-sun PV industry. In the one-sun industry, they may encapsulate using ethylene vinyl acetate (also known as EVA, the copolymer of ethylene and vinyl acetate). The EVA may be used to glue the cell to the glass on the front of the cell and glue the cell to a protective plastic on the back.

In accordance with the present concentrator module 401, a release layer may be applied on the backside of a plastic material (e.g., Teflon). However, here, EVA is not laid on the backside of the cells $320_1$ through $320_n$, inclusive. Thus, the present cells $320_1$ through $320_n$ may have a bare backside which may later be covered with a silicon adhesive to glue to a metal tube. The tube may contain flowing water for cooling in the system application.

After stringing, the cells 410 may be inverted and placed on EVA 420 or other similar thermosetting polymer which in turn sits above a sheet of cover glass 430. The concentrator module 401 may then be placed in a laminator at elevated temperature under vacuum conditions to flow and cure the EVA as is well known in the prior art for one-sun photovoltaic manufacturing. Here again, the fabrication can proceed using automated or semi-automated or even manual one-sun PV manufacturing equipment. An example of such automated equipment is the Spi-Laminator™ automated photovoltaic module laminator available from Spire Corporation. The concentrator module 401 is different from a conventional one-sun module in that only a single string may be needed (rather than the multiple strings that comprise a typical one-sun module). An example of the solar cell stringing process can be found in U.S. Pat. No. 6,841,728 B2 to Jones et al.

Figure 5:
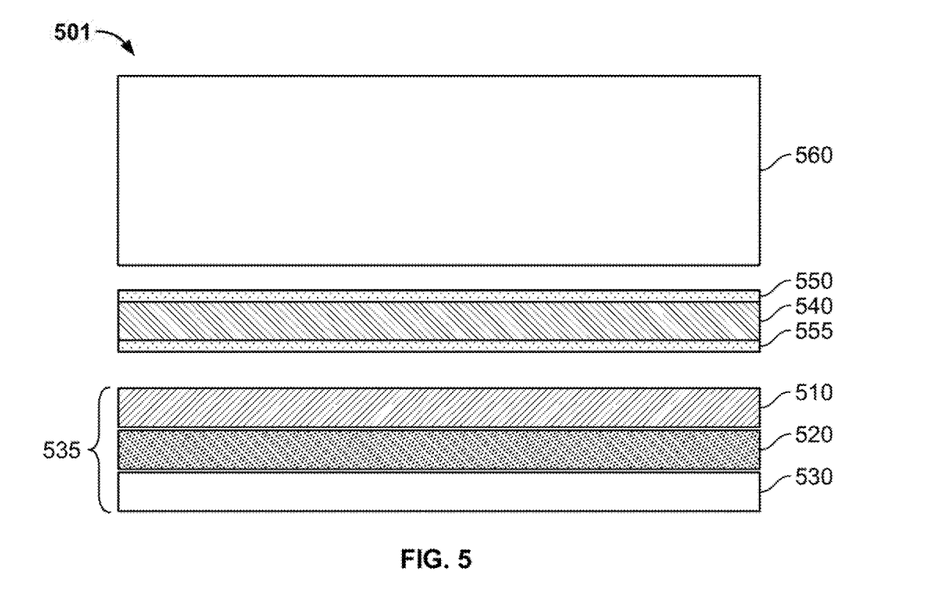
FIG. 5 is an exploded schematic end view of a concentrator receiver that was created from the concentrator module of FIG. 4, in accordance with one embodiment of the present disclosure.

FIG. 5 shows an exploded schematic end view of a concentrator receiver 501 from the concentrator module of FIG. 5. The concentrator receiver 501 comprises the three layers of the concentrator module 535, namely the cells 510 inverted (to sunny-side down) atop EVA 520 which in turn sits above a sheet of cover glass 530. An example of the type of cover glass 530 that may be used here is the Pilkington Optiwhite® glass. This glass is low-iron extra clear float glass which is said to have high solar transmittance for improved solar energy conversion, consistent performance and durability. The concentrator receiver 501 (similar to the receiver 215 of FIG. 2A) uses thin double sticky tape (e.g., polyimide tape with silicon adhesive on both sides) with good dielectric isolation comprising insulating tape 540 with an adhesive layer 550 and a bottom adhesive layer 555, to attach the concentrator module 535 to cooling tube 560. The Spi-Laminator™ automated photovoltaic module laminator may be used to bond the concentrator module 535 to cooling tube 560 via an insulating layer composed of insulating tape 540, adhesive layer 550 and a bottom adhesive layer 555. Insulating layer 540, 550, 555 is essentially double-sticky tape with adhesive on both sides. Double-sided polyimide tape may be used as the insulating layer 540, 550, 555.

The cooling tube 560 is may be fabricated from a high thermal conductivity material (e.g. extruded aluminum). When installed in a complete concentrating PV system, fluid recirculation lines are attached to the ends of the cooling tube 560 and cooling fluid (e.g., water) is flowed through cooling tube 560 to remove heat from the concentrator module 535. Cooling tube 560 may be composed of rectangular metal and water may be flowed therethrough.

Figure 6:
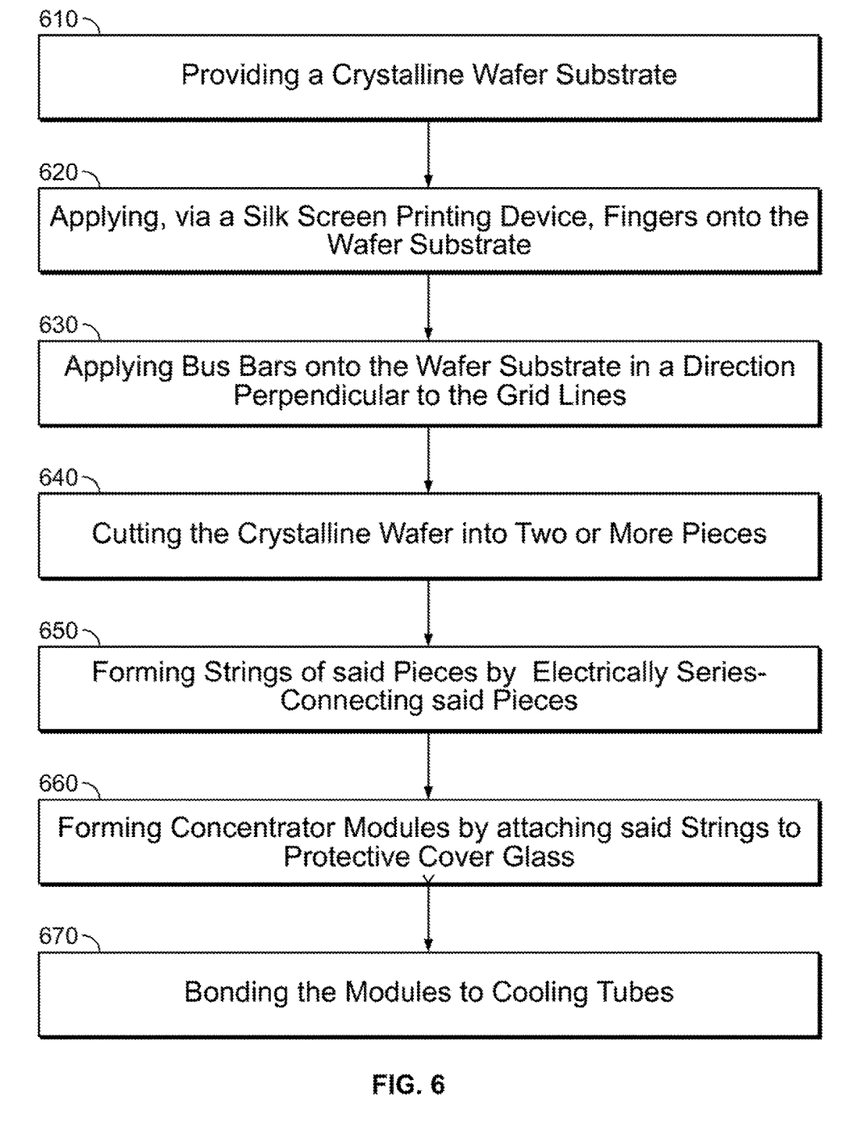
FIG. 6 is a flow chart for a method for making a concentrator module using a wafer precursor in accordance with one embodiment of the present disclosure.

Referring now to FIG. 6, illustrated is a method for manufacturing a solar concentrator module in accordance with one embodiment of the present disclosure. At step 610, the method includes providing a wafer precursor composed of a crystalline wafer substrate. These wafers can be purchased off-the-shelf. Various methods for forming these crystalline wafer structures—monocrystalline and polycrystalline—are known in the art.

Alternatively, monocrystalline silicon wafers can be manufactured using a process to form monocrystalline silicon wafers or panels from a single continuous crystal structure. This continuous structure may be formed when a seed is drawn up with the silicon. As another alternative, a polycrystalline wafer may be made with a silicon crystal seed that is placed in a container of molten silicon. Then, the container of silicon may be cooled, in contrast to the monocrystalline wafer creation process that involves drawing up the seed with the molten silicon.

At step 620, the method involves applying, via a silk screen printing device, fingers onto the wafer substrate. The wafer may include sixty (60) to eighty (80) fingers per two-inch cell (or thirty to forty fingers per inch) formed in a first direction onto the wafer substrate. This finger density may be useful when the concentrator cell is to be used with an optical system having a concentration ratio, e.g., seventeen (17) to fifty (50) times sunlight. Alternatively, the wafer substrate may include twenty (20) to twenty-nine fingers per inch when used with an optical system having a lower concentration, e.g., eight (8) to sixteen (16) times sunlight.

At step 630, the method includes applying bus bars onto the wafer substrate. The bus bars may be applied in a direction perpendicular to the first direction. The bus bars may be two or three in number when applied to a one hundred fifty-six millimeter (156 mm) by 156 mm wafer, and may be made of a conducting metal, e.g., silver or aluminum, as is known in the art. The bus bars may also be applied by soldering tin ribbons onto the wafer substrate.

At step 640, the crystalline wafer is cut into two or more pieces. At step 650, the method includes forming strings of said pieces by electrically series-connecting said pieces. At step 660, the method includes forming concentrator modules by attaching said strings to protective cover glass. At step 670, the method includes bonding the modules to cooling tubes.

Figure 7:
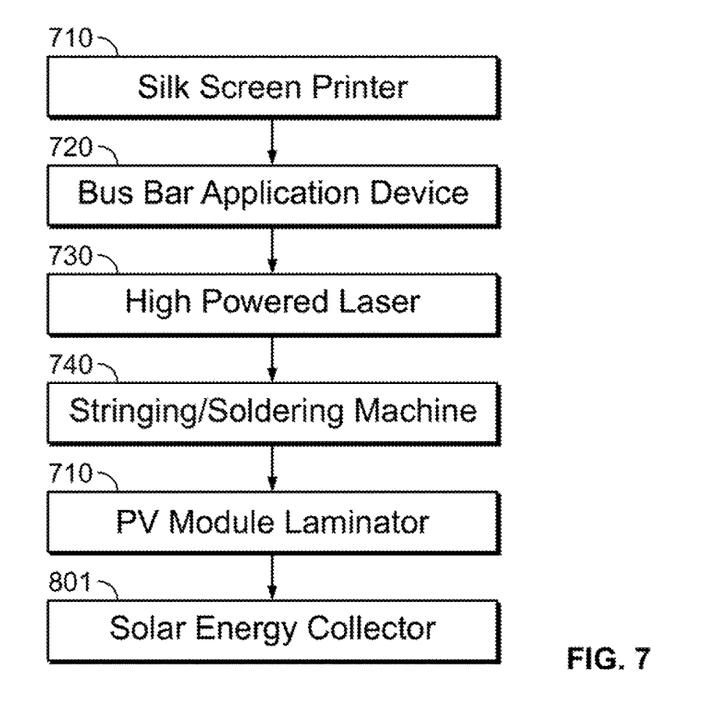
FIG. 7 is a diagram of a system flow for making a concentrator module using a wafer precursor in accordance with one embodiment of the present disclosure.

Referring now to FIG. 7, illustrated is a system for making a concentrator module using a wafer precursor in accordance with one embodiment of the present disclosure. The system includes wafer precursor 101. This wafer precursor 101 is essentially identical to those used for conventional solar cells. It may measure 156 mm by 156 mm. In accordance with the present disclosure, however, a single wafer can produce multiple concentrator cells to be incorporated into multiple concentrator modules.

A silk screen printer 710 can be used to form fingers at the suitable density onto the wafer precursor 101. The wafer precursor 101 can be placed on or in the silk screen printing device so that the fingers may be formed on the wafer precursor 101. Bus bars may be applied using a bus bar application device. The number of bus bars may be two (2) or three (3) for the present disclosure.

At step 730, a high powered laser may be used to cut the wafer precursor into multiple pieces. Other methods of cutting may also be used, e.g., scribe-and-break, diamond saw dicing, or chemical etching.

The cut concentrator cells can be assembled electrically in series by conventional automated one-sun stringing equipment (e.g. manufactured by Spire Corporation in Bedford, Mass., U.S.A.) e.g., the stringing/soldering machine 740 illustrated in FIG. 7. The stringing/soldering machine solders copper ribbons on the top of one cell to the bottom of the next cell in the string as is well known in the one-sun solar cell art. An example of a machine that may be suitable for soldering these copper ribbons is the Spi-Assembler™ 7000.

After stringing, the cells may be inverted and placed on top of EVA or other similar thermosetting polymer which in turn sits above a sheet of cover glass. The concentrator module may then be placed in a laminator at elevated temperature under vacuum conditions to flow and cure the EVA as well known in the prior art for one-sun photovoltaic manufacturing. EVA is typically cured in a lamination process under vacuum and high pressing pressure at about 150-160° C. for a while, e.g., longer than thirty (30) minutes, though faster approaches are becoming more common. The fabrication can proceed using automated or semi-automated or even manual one-sun PV manufacturing equipment. An example of such automated equipment is the Spi-Laminator™ automated photovoltaic module laminator available from Spire Corporation.

The concentrator module may then be incorporated into a solar energy collector system or other optical system. In accordance with the present disclosure, the solar energy collector system may have an aperture having a size range from about ten (10) square feet to about one thousand (1000) square feet.

Figure 8:
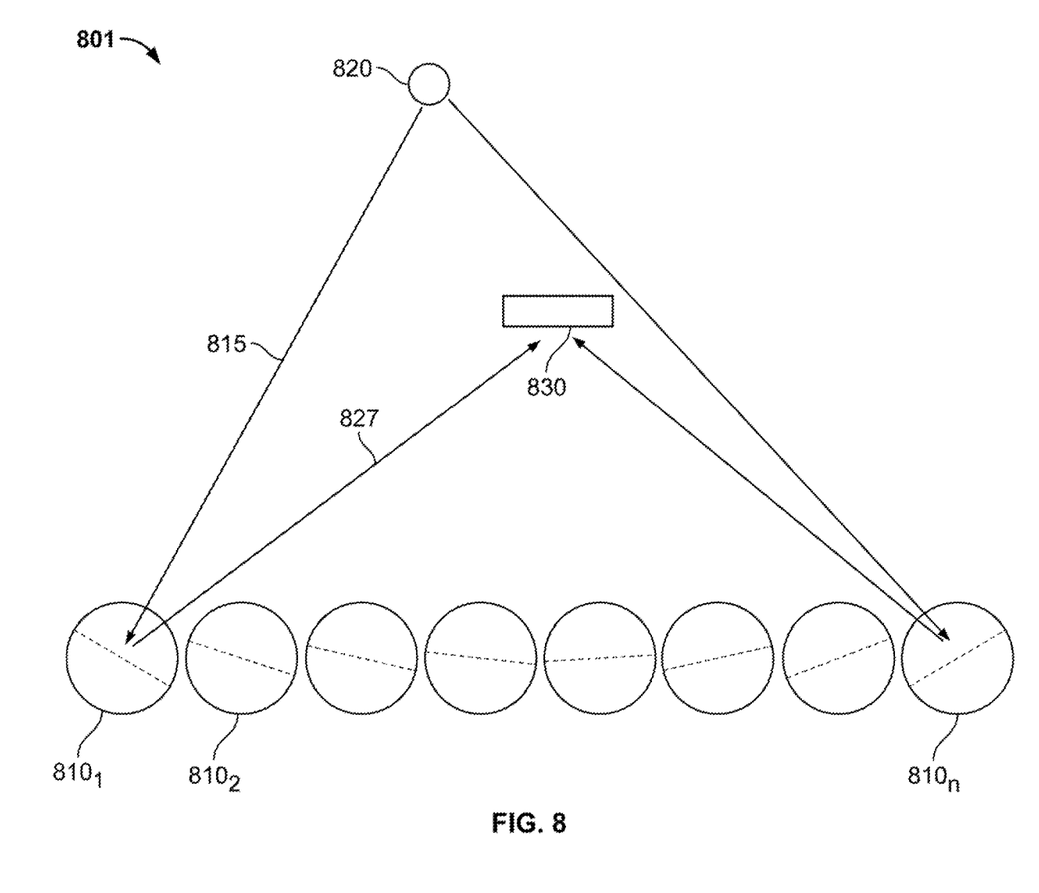
FIG. 8 is a diagram of a reflector system in accordance with one embodiment of the present disclosure.

Referring now to FIG. 8, illustrated is a diagram of a reflector system 801 that comprises a set of ground mounted reflectors $810_1$, $810_2$, through $810_n$, that are arrayed in parallel. It should be understood that a number of different architectures can be used in lieu of the array show in FIG. 8. In lieu of the illustrated parallel array, the reflectors $810_1$, $810_2$, through $810n$, could take on other architectures, e.g., a linear fernel, or trough as described later in connection with FIG. 8, or a dish or a heliostat.

Reflectors $810_1$, $810_2$, through $810_n$, may be composed of mirrors. The reflectors $810_1$, $810_2$, through $810_n$ may be driven collectively or individually, to track movement of the sun relative to the earth. The reflectors $810_1$, through $810n$, are oriented to receive from solar radiation 815 from sun 820, and to reflect the reflected solar radiation 827 to a receiver 830. The reflectors $810_1$, $810_2$, through $810_n$, are arranged so that they receive sunlight and reflect that sunlight back to receiver 830.

Figure 9A:
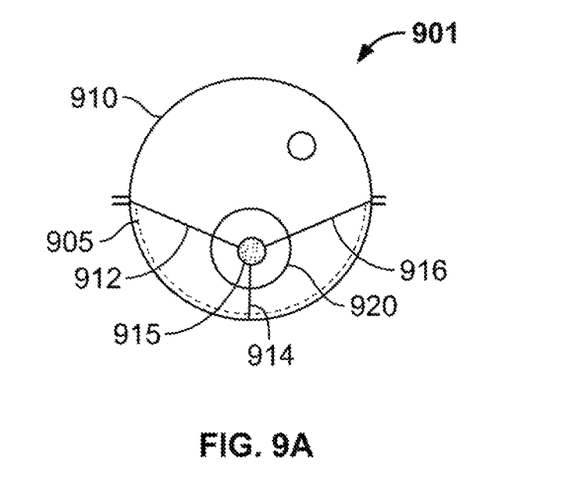
FIG. 9A is an end view of an embodiment of a solar energy collector in accordance with one aspect of the present disclosure.
Figure 9B:
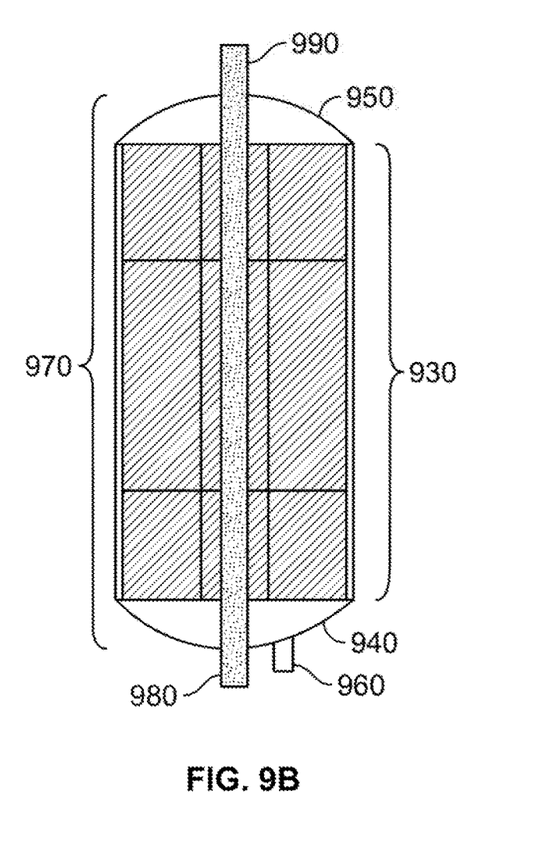
FIG. 9B is a top view of the solar energy collector of FIG. 9A.

Referring now to FIG. 9A, illustrated is an end view of a solar energy collector that can be used with the concentrator module and method of the present disclosure. FIG. 9B is a top view of the solar energy collector of FIG. 9A. The length of the collector can be relatively short or very much longer depending on particular application needs. The present concentrator module can be used with optical systems that feed light to the concentrator module. Solar energy collector 901 is an example of an optical system that feeds the light to the concentrator module. Generally, the optical system determines the concentration ratio. Here, solar energy collector 901 determines the concentration ratio.

Solar energy collector 901 comprises a reflector 905 with a concentrating shape, which in this case is approximately the shape of a section of a cylindrical tube. The cylindrical shape is a specific example of an approximately constant cross-sectional shape. The cylindrical shape is a specific example of a surface with substantial curvature in only one dimension. Reflector 905 is held in place and in shape by window sheet 910 which is an example of a first support means for the reflector 905. By itself, reflector 905 would not be able to maintain its shape against the force of gravity since it is very thin and hence very flexible. The window sheet 910 is sealed against the long edges (lengthwise edges) of reflector to form a substantially leak-tight cylindrical structure 930 when pressurized within by a suitable gas (such as air).

To form a completely sealed vessel, the short ends (lateral edges) of the cylindrical structure 930 can be simply sealed (not illustrated), or sealed by attaching to seal end 940, a first bulkhead and seal end 950, a second bulkhead. The bulkheads can be constructed of thick and hence rigid materials (e.g. wood, plastic, metal etc.) or of thin flexible materials. Seal end 950 can also comprise an input port 960 to enable pressurization of the interior of the vessel 970. Seal end 940 can also comprise a fluid input 980 and seal end 950 can also comprise a fluid output 990 to provide cooling fluid to receiver 915 which is an example of a receiving zone.

The reflector 905 and window sheet 910 may be polymer (e.g. polyester terephthalate (PET)) film with a thickness under 250 μm. For added lifetime, the reflector 905 and window sheet 910 may also be protected by a thin topcoat of acrylic containing ultraviolet (UV) light blockers, stabilizers, or brighteners or the like as are well known in the art of sunlight stabilization of polymers. To provide light reflecting characteristics to reflector 905 a metallized (e.g. aluminum) layer may be included. Solar energy collector 901 also comprises a receiver 915 which is an example of a receiving zone.

Solar energy collector 901 can optionally comprise a glazed tube 920. Glazed tube 920 may be desirable when collector 901 is used to collect sunlight in the converted energy to form heat.

Figure 9C:
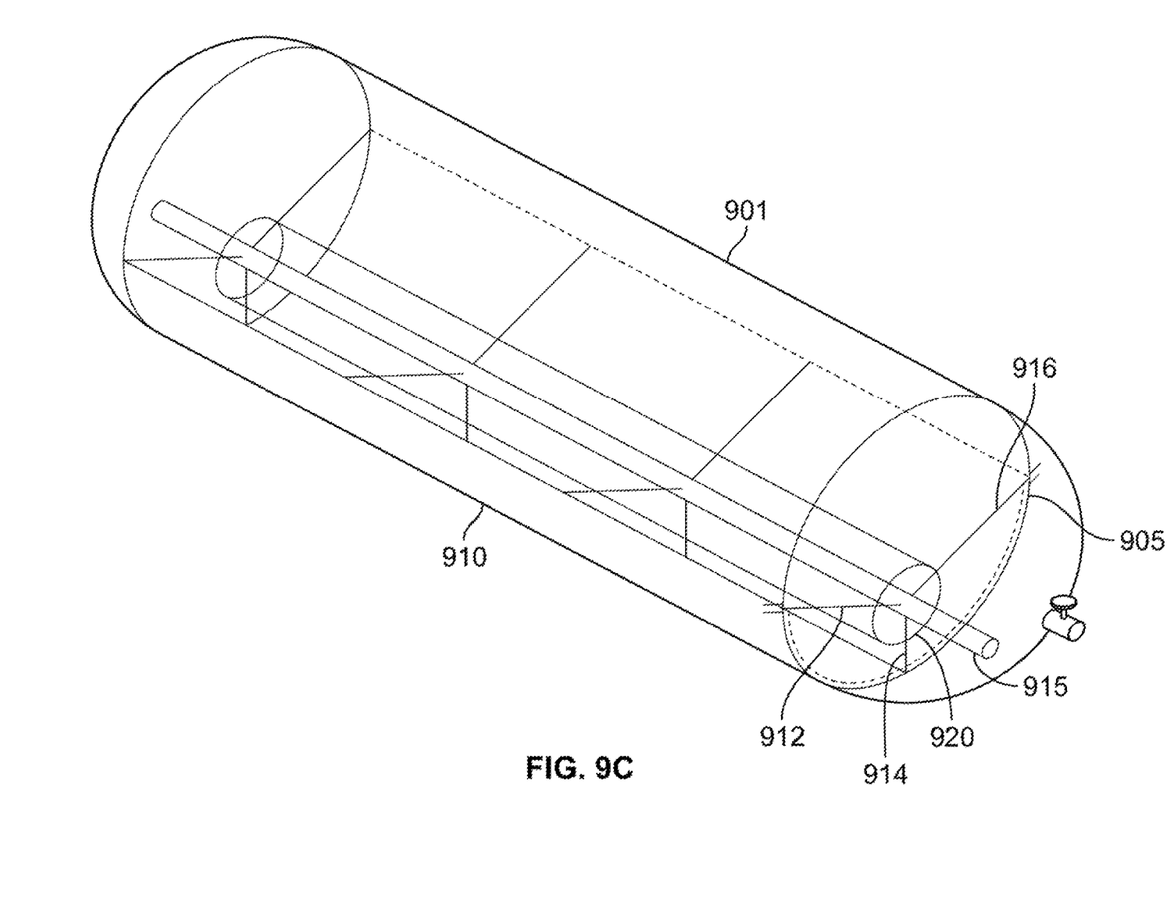
FIG. 9C is a perspective or isometric view of the solar energy collector of FIGS. 9A and 9B.

FIG. 9C shows a perspective or isometric view of the solar energy collector assembly 901, which in one embodiment comprises a sealed and inflated cylindrical-tube shaped housing 901. As shown in FIG. 9C, the solar collector assembly 901 comprises a sealed and inflated cylindrical-tube shaped housing. The tube housing includes a bottom cylindrically-trough shaped reflector portion having a reflection surface extending along a longitudinal length. The reflection surface may be made of a relatively thin and flexible metalized polymer film.

The assembly 901 further includes a top cylindrically-shaped transparent polymer film sheet portion made of a relatively thin and flexible polymer film. The top and bottom sheet portions form a pressure sealed cylindrical tube housing when the respective ends of the top and bottom films are sealed together and the tube housing is inflated with a gas via valve 930 so that the top transparent film portion passes solar energy to the reflection surface. The collector assembly shown in FIG. 9C further includes a receiver tube disposed longitudinally above the reflection surface in a focal line or focal plane of the cylindrical-trough shaped reflector portion. The absorber tube extends along the longitudinal length of the reflection surface, and contains a heat transfer fluid for absorbing solar energy reflected from the reflection surface to the focal line or focal plane.

Figure 9D:
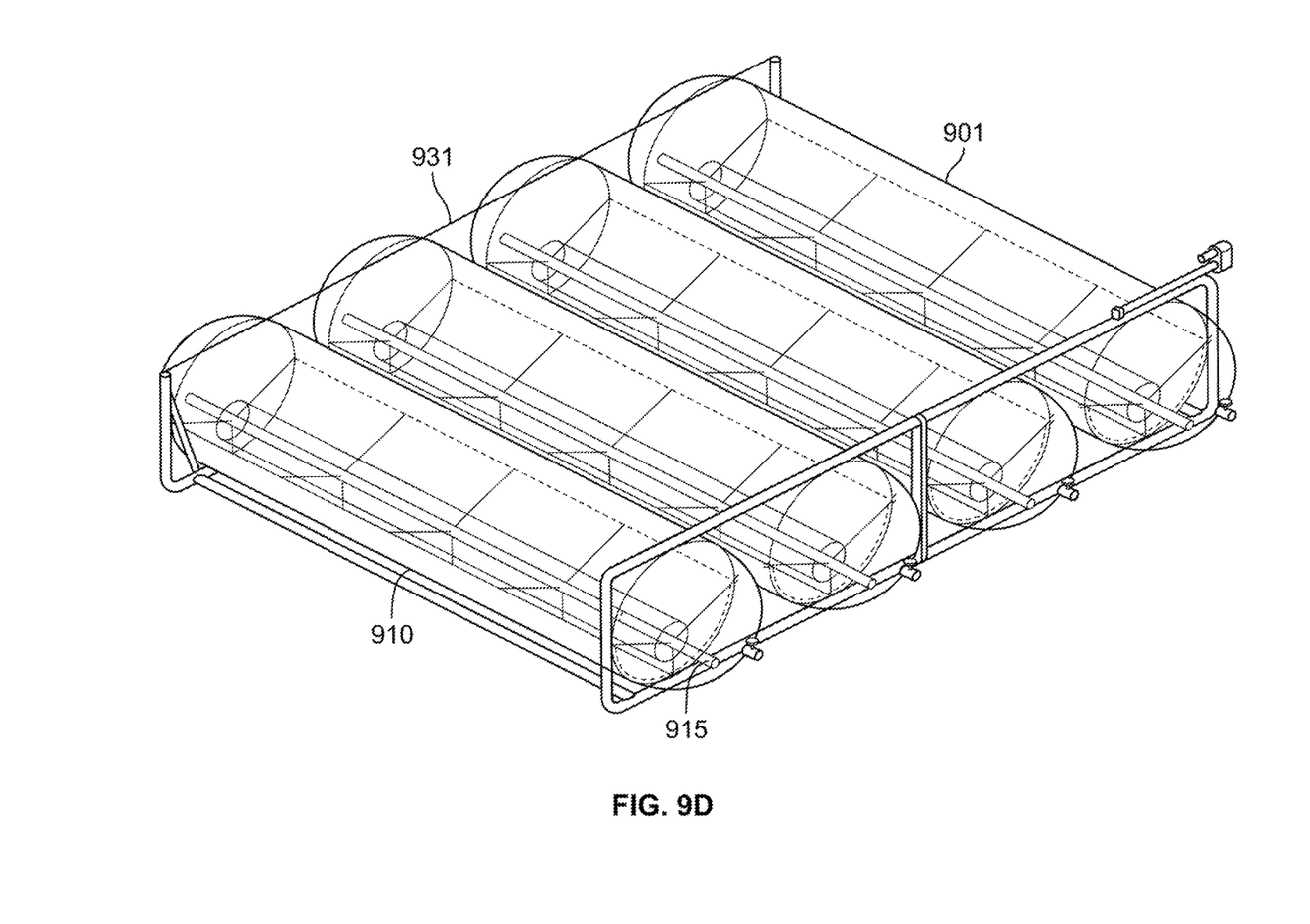
FIG. 9D is a perspective view of the solar energy collector array of FIG. 9A.

FIG. 9D is a perspective view of a solar energy collector array, in which four solar collector assemblies 901 are combined in an array configuration. The solar collector array shown in FIG. 9D is supported by support frame 940 and can be moved by a suitable drive/tracking system 950. The array configuration shown in FIG. 9D is suitable for mounting on a support structure, such as the roof of a building, a ground surface open area, or the like. Optional restraint line 931 is shown attached at two points of support frame 940. The restraint line 931 can be used to ensure that collector assemblies 901 remain located atop support frame 940 even in the presence of strong winds. The restraint line 931 may be made of lightweight yet strong material (e.g. nylon rope or steel cable). The area of the collector assemblies 901 that is perpendicular to the beam of light coming from the sun may be described as the aperture. The aperture may have a size ranging from a few square feet to one thousand feet or more. In the embodiment of FIG. 9D, the aperture size ranges from ten square feet to about one thousand square feet.

The method for fabricating the concentrator cell from the wafer precursor includes a few simple parts. The method can be carried out inexpensively.

The method disclosed herein involves very few steps to complete the fabrication of the module, thereby reducing labor costs.

The steps of the method disclosed herein can be carried out without using expensive machinery. The method disclosed herein can be accomplished with inexpensive standard tools.

The foregoing description of various embodiments have been presented for purposes of illustration and description. It is not intended to be exhaustive or to limit the invention to the precise forms disclosed, and obviously many modifications and variations are possible in light of the above teaching. The example embodiments, as described above, were chosen and described in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed as new and desired to be protected by Letters Patent of the United States is:

1. A method of producing a photovoltaic concentrator module from a wafer precursor, the method comprising the steps of:
   providing a wafer precursor composed of a crystalline silicon wafer substrate;
   applying, via a silk screen printing device, fingers onto the crystalline silicon wafer substrate, wherein the fingers are applied as horizontal grid lines across the crystalline silicon wafer substrate;
   applying, via a bus bar application device, bus bars onto the crystalline silicon wafer substrate, wherein the bus bars are applied in a direction perpendicular to the grid lines to form multiple separate top grid structures, wherein a number of separate top grid structures is either at least two for each concentrator module, or wherein the number of separate top grid structures is at least three for each concentrator cell module;
   cutting the crystalline silicon wafer substrate into two or more pieces, wherein the cutting is performed in a direction perpendicular to said bus bars;

forming one or more strings of said pieces by electrically series-connecting said pieces by soldering with copper ribbons; and forming one or more concentrator modules by attaching said one or more strings to protective cover glass by vacuum laminating with thermosetting transparent polymer, wherein when the number of separate top grid structures is at least two for each concentrator module, the concentrator module is part of solar energy collector system that has a concentration ratio of between about eight and about sixteen times sunlight, and wherein when the number of separate top grid structures is at least three for each concentrator module, the concentrator module is part of a solar energy collector system that has a concentration ratio of between about seventeen and about fifty times sunlight.

2. The method of claim 1, further comprising the step of:
forming one or more concentrator modules by attaching said one or more strings to protective cover glass, including the steps of vacuum laminating the protective cover glass with thermosetting transparent polymer, and bonding said one or more concentrator modules to cooling tubes via an insulating layer.

3. The method of claim 2, wherein the thermosetting transparent polymer is EVA disposed on a sunny side down side of the concentrator module.

4. The method of claim 1, wherein the cutting step is performed by laser cutting, scribe-and-break, diamond saw dicing, or chemical etching.

5. The method of claim 1, wherein the solar energy collector system includes an aperture having a size range from about ten square feet to about one thousand square feet.

6. The method of claim 1, wherein when the number of separate top grid structures is at least three for each concentrator module, a density of the fingers on the crystalline silicon wafer substrate is between about thirty fingers per inch and about forty fingers per inch.

7. The method of claim 1, wherein when the number of separate top grid structures is at least two for each concentrator module, a density of the fingers on the crystalline silicon wafer substrate is between about twenty fingers per inch and about twenty-nine fingers per inch.

8. The method of claim 1, wherein the crystalline silicon wafer substrate is a monocrystalline silicon wafer substrate.

9. A system for producing a photovoltaic concentrator module from a wafer precursor, the system comprising:
a wafer precursor composed of a crystalline silicon wafer substrate;
fingers formed on the crystalline silicon wafer substrate, wherein a silk screen printing device forms the fingers as horizontal grid lines across the crystalline silicon wafer substrate; and
bus bars applied to the crystalline silicon wafer substrate, wherein the bus bars are applied in a direction perpendicular to the grid lines to form separate top grid structures;
a cutting device configured to cut the crystalline silicon wafer substrate into two or more pieces, wherein the cutting is performed in a direction perpendicular to said bus bars;
one or more strings of said pieces formed by electrically series-connecting said pieces via soldering with copper ribbons; and one or more concentrator modules formed by attaching said one or more strings to protective cover glass via vacuum laminating with thermosetting transparent polymer;

wherein a number of separate top grid structures is either at least two for each concentrator module, or the number of top grid structures is at least three for each concentrator module, wherein when the number of separate top grid structures is at least two for each concentrator module, the concentrator module is part of solar energy collector system that has a concentration ratio of between about eight and about sixteen times sunlight, and wherein when the number of separate top grid structures is at least three for each concentrator module, the concentrator module is part of a solar energy collector system that has a concentration ratio of between about seventeen and about fifty times sunlight.

10. The system of claim 9, wherein the width of each finger is about one hundred microns.

11. The system of claim 9, wherein the solar energy collector system includes an aperture having a size range from about ten square feet to about one thousand square feet.

12. The system of claim 9, wherein the thickness of each finger is between about five microns and thirty microns.

13. A method of producing a photovoltaic concentrator module from a wafer precursor, the method comprising the steps of:
providing a wafer precursor composed of a crystalline silicon wafer substrate;
forming, via a silk screen printing device, fingers onto the crystalline silicon wafer substrate, wherein the fingers are applied as horizontal grid lines across the crystalline wafer substrate;
applying, via a bus bar application device, bus bars onto the crystalline silicon wafer substrate, wherein the bus bars are applied in a direction perpendicular to the grid lines to form multiple separate top grid structures, wherein a number of separate top grid structures is either at least two for each concentrator module, or the number of top grid structures is at least three for each concentrator module, wherein when the number of separate top grid structures is at least two for each concentrator module, the concentrator module is part of a solar energy collector system that has a concentration ratio of between about eight and about sixteen times sunlight, and wherein when the number of separate top grid structures is at least three for each concentrator module, the concentrator module is part of a solar energy collector system that has a concentration ratio of between about seventeen and about fifty times sunlight;
cutting the crystalline silicon wafer substrate into two or more pieces, wherein the cutting is performed in a direction perpendicular to said bus bars;
forming one or more strings of said pieces by electrically series-connecting said pieces by soldering with copper ribbons;
forming one or more concentrator modules by attaching said one or more strings to a protective cover glass by vacuum laminating with thermosetting transparent polymer; and
bonding said one or more concentrator modules to cooling tubes via an insulating layer.

14. The method of claim 13, wherein when the solar energy collector system has a concentration ratio between about eight and about sixteen times sunlight, a density of the fingers on the crystalline silicon wafer substrate is between about twenty fingers per inch and about twenty-nine fingers per inch.

15. The method of claim 13, wherein the crystalline silicon wafer substrate is a monocrystalline silicon wafer substrate.

16. The method of claim 13, wherein the solar energy collector system includes an aperture having a size range from about ten square feet to about one thousand square feet.

17. The method of claim 13, wherein when the solar energy collector system has a concentration ratio between about seventeen and about fifty times sunlight, a density of the fingers on the crystalline silicon wafer substrate is between about thirty fingers per inch and about forty fingers per inch.

* * * * *